US008325544B2

United States Patent
Kang et al.

(10) Patent No.: US 8,325,544 B2
(45) Date of Patent: Dec. 4, 2012

(54) SYNCHRONOUS DYNAMIC RANDOM ACCESS MEMORY SEMICONDUCTOR DEVICE FOR CONTROLLING OUTPUT DATA

(75) Inventors: Sang-kyu Kang, Yongin-si (KR); Ho-cheol Lee, Yongin-si (KR); Chi-sung Oh, Gunpo-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 283 days.

(21) Appl. No.: 12/702,809

(22) Filed: Feb. 9, 2010

(65) Prior Publication Data

US 2011/0007576 A1    Jan. 13, 2011

(30) Foreign Application Priority Data

Jul. 9, 2009   (KR) .................. 10-2009-0062566

(51) Int. Cl.
*G11C 7/00* (2006.01)
(52) U.S. Cl. .............. 365/193; 365/233.13; 365/189.05; 365/233.1; 365/149
(58) Field of Classification Search .................. 365/193, 365/233.13, 233.1, 149, 189.05
See application file for complete search history.

(56) References Cited

U.S. PATENT DOCUMENTS

| 5,764,590 | A | 6/1998 | Iwamoto et al. |
| 6,671,787 | B2 | 12/2003 | Kanda et al. |
| 6,708,255 | B2 | 3/2004 | Yi |
| 2004/0196725 | A1* | 10/2004 | Kang ....................... 365/230.08 |
| 2008/0192558 | A1* | 8/2008 | Yoshida et al. ............. 365/225.7 |
| 2010/0182856 | A1* | 7/2010 | Koshizuka .................... 365/193 |
| 2010/0182857 | A1* | 7/2010 | Arai et al. ..................... 365/193 |

FOREIGN PATENT DOCUMENTS

| JP | 09223389 | 8/1997 |
| JP | 2000182399 | 6/2000 |
| KR | 1020020058931 A | 12/2002 |

* cited by examiner

*Primary Examiner* — Vu Le
*Assistant Examiner* — Han Yang
(74) *Attorney, Agent, or Firm* — Volentine & Whitt, PLLC

(57) ABSTRACT

Provided is a synchronous dynamic random access memory (DRAM) semiconductor device including multiple output buffers, a strobe control unit and multiple strobe buffers. Each of the output buffers is configured to output one bit of data. The strobe control unit is configured to output multiple strobe control signals in response to an externally input signal. The strobe buffers are connected to the output buffers and the strobe control unit, and each of the strobe buffers is configured to output at least one strobe signal. At least some of the strobe buffers are activated in response to the strobe control signals, and the output buffers are activated in response to the strobe signals output by the activated strobe buffers.

13 Claims, 8 Drawing Sheets

SYNCHRONOUS DYNAMIC RANDOM ACCESS MEMORY SEMICONDUCTOR DEVICE FOR CONTROLLING OUTPUT DATA

CROSS-REFERENCE TO RELATED APPLICATIONS

A claim of priority is made to Korean Patent Application No. 10-2009-0062566, filed on Jul. 9, 2009, in the Korean Intellectual Property Office, the subject matter of which is hereby incorporated by reference.

BACKGROUND

The inventive concept relates to a semiconductor memory device, and more particularly, to a synchronous dynamic random access memory (DRAM) semiconductor device capable of controlling data that is to be output or input.

A semiconductor memory device includes a memory in which data is stored. External data is written to the memory in response to a write signal, whereas data stored in the memory is output from the memory in response to a read signal.

A semiconductor memory device also includes an output buffer, and data stored in the memory is output via the output buffer. Signals used by an external apparatus that performs data communication with the semiconductor memory device may have different voltage levels as compared to those of signals used by the semiconductor memory device. In this case, the output buffer converts voltage levels of data output by the memory to suitable voltage levels for operations of the external apparatus.

A synchronous DRAM semiconductor device includes an output data strobe buffer. The output data strobe buffer generates an output strobe signal to control data output from the output buffer.

Such synchronous DRAM semiconductor devices are capable of inputting and outputting data, and use of such synchronous DRAM semiconductor devices is continuously increasing. As more data is input and output, the synchronous DRAM semiconductor device consumes more power.

SUMMARY

The inventive concept provides a synchronous dynamic random access memory (DRAM) semiconductor device that consumes less power when outputting data.

According to an aspect of the inventive concept, there is provided a synchronous dynamic random access memory (DRAM) semiconductor device including multiple output buffers, a strobe control unit and multiple strobe buffers. Each of the output buffers is configured to output one bit of data. The strobe control unit is configured to output multiple strobe control signals in response to an externally input signal. The strobe buffers are connected to the output buffers and the strobe control unit, and each of the strobe buffers is configured to output at least one strobe signal. At least some of the strobe buffers are activated in response to the strobe control signals, and the output buffers are activated in response to the strobe signals output by the activated strobe buffers.

The strobe control unit may include an expanded mode register set (EMRS) that outputs the strobe control signals.

According to another aspect of the inventive concept, there is provided a synchronous DRAM semiconductor device including multiple output buffers, a fuse unit and multiple strobe buffers. Each of the output buffers is configured to output one bit of data. The fuse unit includes multiple fuses and is configured to output multiple strobe control signals according to shorts of the fuses, where voltages are applied to first ends of the fuses. The strobe buffers are connected to the output buffers and the fuse unit, and each of the strobe buffers is configured to output at least one strobe signal. At least some of the strobe buffers are activated in response to the strobe control signals, and the output buffers are activated in response to the strobe signals output by the activated strobe buffers.

The synchronous DRAM semiconductor device may further include a logic unit connected to at least some of the fuses of the fuse unit. The logic unit is configured to combine signals output by the connected fuses and to output the strobe control signals based on the combined signals.

According to another aspect of the inventive concept, there is provided a synchronous DRAM semiconductor device including multiple output buffers, a frequency detecting unit and multiple strobe buffers. Each of the output buffers is configured to output one bit of data. The frequency detecting unit is configured to detect frequency of an externally input signal and to output multiple strobe control signals according to the detected frequency of the input signal. The strobe buffers are connected to the output buffers and the strobe control unit, each of the strobe buffers is configured to output at least one strobe signal. At least some of the strobe buffers are activated in response to the strobe control signals, and the output buffers are activated in response to the strobe signals output by the activated strobe buffers.

More than eight of the output buffers may be activated in response to the strobe signals output by the activated strobe buffers.

Either all of or $$\frac{1}{2^n}$$

(n being a natural number) of the strobe buffers may be simultaneously activated in response to the strobe signals.

When all of the strobe buffers are activated, eight of the output buffers are simultaneously activated by one of the strobe buffers. When $$\frac{1}{2^n}$$

(n being a natural number) of the strobe buffers are activated, $8 \times 2^n$ (n being a natural number) of the output buffers are simultaneously activated by one of the strobe buffers.

The synchronous DRAM semiconductor device may further include a masking control unit connected to the output buffers and configured to mask at least some of the output buffers. The masked output buffers do not output data.

BRIEF DESCRIPTION OF THE DRAWINGS

The embodiments of the present inventive concept will be described with reference to the attached drawings, in which.

DETAILED DESCRIPTION OF THE EMBODIMENTS

Figure 1:
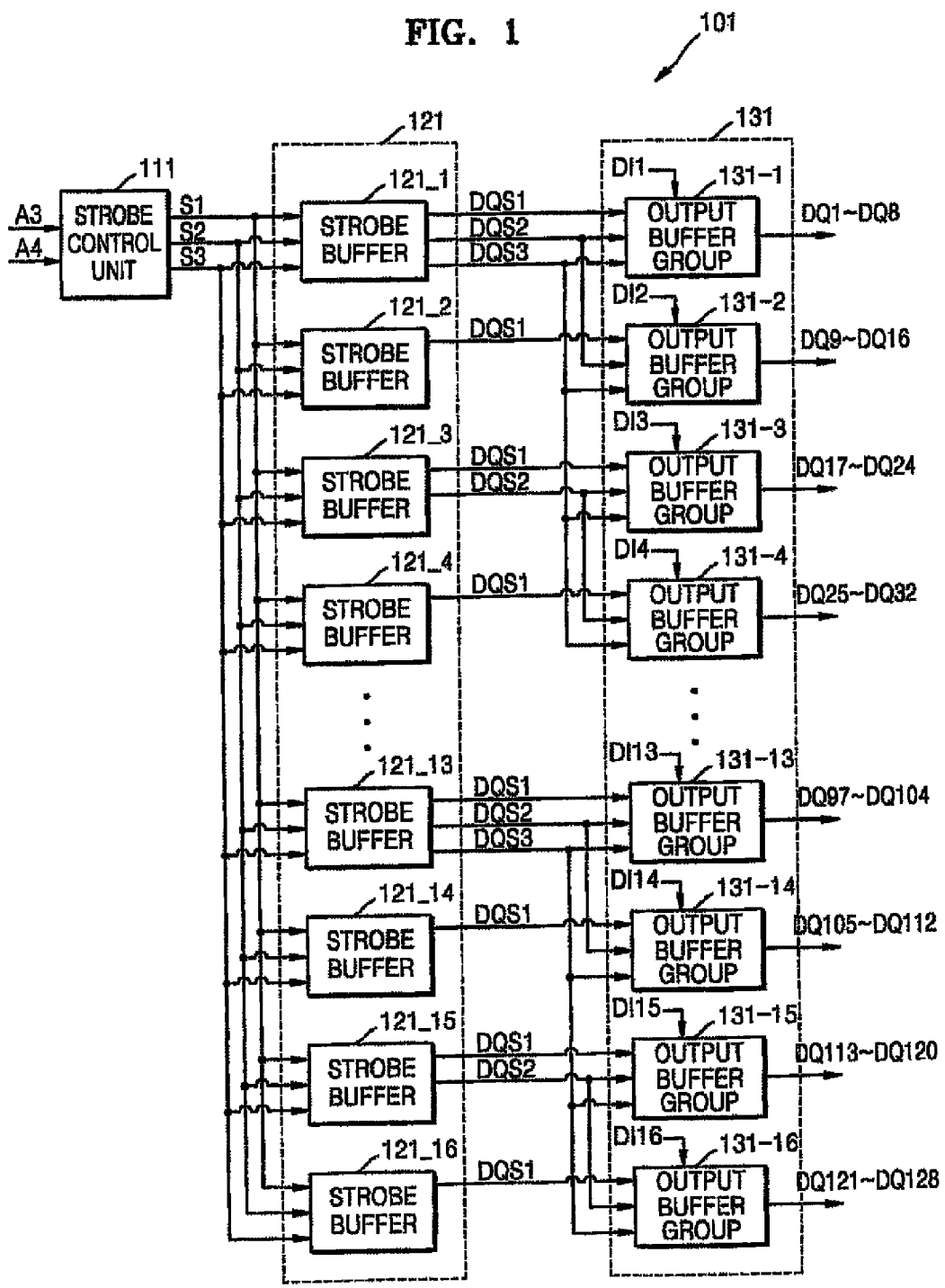
FIG. 1 is a block diagram of a synchronous dynamic random access memory (DRAM) semiconductor device, according to an embodiment of the inventive concept.

The present inventive concept will be described more fully with reference to the accompanying drawings, in which exemplary embodiments of the inventive concept are shown. The inventive concept, however, may be embodied in various different forms, and should not be construed as being limited only to the illustrated embodiments. Rather, these embodiments are provided as examples, to convey the inventive concept to one skilled in the art. Accordingly, known processes, elements, and techniques are not described with respect to some of the embodiments. Like reference numerals in the drawings denote like elements.

FIG. 1 is a block diagram of a synchronous dynamic random access memory (DRAM) semiconductor device 101, according to an embodiment of the inventive concept. Referring to FIG. 1, the synchronous DRAM semiconductor device 101 includes a strobe control unit 111, a strobe buffer unit 121, and an output buffer unit 131. The synchronous DRAM semiconductor device 101 of FIG. 1 has input 128-bits of data and outputs 128-bits of data, for example.

The strobe control unit 111 is connected to the strobe buffer unit 121. Signals A3 and A4 are input to the strobe control unit 111, and the strobe control unit 111 selectively outputs strobe control signals S1 through S3. In other words, the strobe control unit 111 selectively enables first through third strobe control signals S1 through S3 in response to the two (2) externally input signals A3 and A4. Sixteen (16) strobe buffers 121_1 through 121_16 are selectively activated in response to the selectively enabled first through third strobe control signals S1 through S3. Operations of the strobe control unit 111 will be described below in reference to Table 1.

TABLE 1

| A3 | A4 | Strobe Control Signals |
|---|---|---|
| 0 | 0 | First strobe control signal S1 is enabled. |
| 1 | 0 | Second strobe control signal S2 is enabled. |
| 0 | 1 | Third strobe control signal S3 is enabled. |
| 1 | 1 | All strobe control signals are disabled. |

Referring to Table 1, when both of the input signals A3 and A4 are logic low, the strobe control unit 111 enables the first strobe control signal S1 only. When the input signal A3 is logic high and the input signal A4 is logic low, the strobe control unit 111 enables the second strobe control signal S2 only. When the input signal A3 is logic low and the input signal A4 is logic high, the strobe control unit 111 enables the third strobe control signal S3 only. When both of the input signals A3 and A4 are logic high, the strobe control unit 111 disables all of the strobe control signals.

When the first through third strobe control signals S1 through S3 are enabled or disabled, voltage levels thereof may be set to logic high or logic low, respectively. For example, when the voltage level is logic high, a state of the corresponding first through third strobe control signal S1 through S3 is set as an enabled state, and when the voltage level is logic low, the state of the corresponding first through third strobe control signal S1 through S3 is set as a disabled state.

In various implementations, the selective enablement of the first through third strobe control signals S1 through S3 may be configured differently than the operations shown in Table 1, without departing from the scope of the present teachings. For example, the first through third strobe control signals S1 through S3 may be all disabled when both of the input signals A3 and A4 are logic low, and only the first strobe control signal S1 may be enabled when both of the input signals A3 and A4 are logic high.

The strobe control unit 111 may include a mode register set (MRS) or an expanded MRS (EMRS), which may be externally adjusted. According to the configuration of the strobe control unit 111, the enablement of the first through third strobe control signals S1 through S3 may vary.

The strobe buffer unit 121 is connected to the strobe control unit 111 and the output buffer unit 131. The strobe control signals S1 through S3 are input to the strobe buffer unit 121, and the strobe buffer unit 121 outputs strobe signals DQS1 through DQS3. In other words, the first through third strobe signals DQS1 through DQS3 are either enabled or disabled in response to the first through third strobe control signals S1 through S3. When the first through third strobe signals DQS1 through DQS3 are enabled or disabled, voltage levels thereof may be set to logic high or logic low, respectively. For example, when the voltage level is logic high, a state of the corresponding first through third strobe signal DQS1 through DQS3 is set as an enabled state. When the voltage level is logic low, the state of the corresponding first through third strobe signal DQS1 through DQS3 is set as a disabled state. In various implementations, the enabled and disabled states may be reversed without departing from the scope of the present teachings.

The strobe buffer unit 121 includes multiple strobe buffers, e.g., sixteen (16) strobe buffers 121_1 through 121_16. The first through third strobe control signals S1 through S3 are input to each of the sixteen (16) strobe buffers 121_1 through 121_16, and each of the sixteen (16) strobe buffers 121_1 through 121_16 outputs at least one of the first through third strobe signals DQS1 through DQS3.

In an embodiment, the sixteen (16) strobe buffers 121_1 through 121_16 in the strobe buffer unit 121 are configured into four (4) groups, each of which includes four (4) of the sixteen (16) strobe buffers 121_1 through 121_16. For example, the first group of strobe buffers in the strobe buffer unit 121 includes strobe buffers 121_1 through 121_4. The first through third strobe control signals S1 through S3 are input to the first strobe buffer 121_1, which is configured to output the first through third strobe signals DQS1 through DQS3. The first through third strobe control signals S1 through S3 are input to the second strobe buffer 121_2, which is configured to output the first strobe signal DQS1 only. The first through third strobe control signals S1 through S3 are input to the third strobe buffer 121_3, which is configured to output the first and second strobe signal DQS1 and DQS2. The first through third strobe control signals S1 through S3 are input to the fourth strobe buffer 121_4, which is configured to output the first strobe signal DQS1 only.

The configurations of the strobe buffers in the other groups of the strobe buffer unit 121 are configured the same as the strobe buffers 121_1 through 121_4 in the first group. For example, the second group of strobe buffers in the strobe buffer unit 121 includes strobe buffers 121_5 through 121_8, which are configured the same as strobe buffers 121_1 through 121_4, respectively.

When the first strobe control signal S1 is enabled, all of the sixteen (16) strobe buffers 121_1 through 121_16 are activated. Then, the sixteen (16) strobe buffers 121_1 through 121_16 enable the first strobe signals DQS1, while some of the sixteen (16) strobe buffers 121_1 through 121_16 disable the second strobe signal DQS2 (e.g., strobe buffers 121_3, 121_7, 121_11, 121_15) or the second and third strobe signals DQS2 and DQS3 (e.g., strobe buffers 121_1, 121_5, 121_9, 121_13).

When the second strobe control signal S2 is enabled, half (½) of the sixteen (16) strobe buffers 121_1 through 121_16 are activated. That is, eight (8) strobe buffers 121_1, 121_3, . . . , 121_15 are activated. Then, the eight (8) activated strobe buffers 121_1, 121_3, . . . , 121_15 enable the second strobe signals DQS2 and disable the first strobe signals DQS1, while some of the eight (8) strobe buffers 121_1, 1213, . . . , 121_15 also disable the third strobe signals DQS3 (e.g., strobe buffers 121_1, 121_5, 121_9, 121_13).

When the third strobe control signal S3 is enabled, one-fourth (¼) of the sixteen (16) strobe buffers 121_1 through 121_16 are activated. That is, four (4) strobe buffers 121_1, 121_5, 121_9 and 121_13 are activated. Then, the four (4) activated strobe buffers 121_1, 121_5, 121_9 and 121_13 enable the third strobe signals DQS3 and disable the first and second strobe signals DQS1 and DQS2.

When all of the first through third strobe control signals S1 through S3 are disabled, all of the sixteen (16) strobe buffers 121_1 through 121_16 are deactivated. Then, the sixteen (16) strobe buffers 121_1 through 121_16 disable all of the first through third strobe signals DQS1 through DQS3.

Accordingly, the sixteen (16) strobe buffers 121_1 through 121_16 are selectively activated according to the selective enablement of the first through third strobe control signals S1 through S3. As the number of the strobe buffers 121_1 through 121_16 that are activated decreases, the synchronous DRAM semiconductor device 101 consumes less power.

The output buffer unit 131 is connected to the strobe buffer unit 121. The strobe signals DQS1 through DQS3 are input to the output buffer unit 131, and the output buffer unit 131 outputs multiple bits of data DQ1 through DQ128. In other words, in the depicted embodiment, the output buffer unit 131 outputs one-hundred twenty eight (128) bits of data DQ1 through DQ128.

The output buffer unit 131 includes multiple output buffer groups, e.g., sixteen (16) output buffer groups 131_1 through 131_16. Each of the output buffer groups 131_1 through 131_16 includes eight (8) output buffers connected in parallel, and each output buffer outputs one (1) bit of data. Thus, each of the output buffer groups 131_1 through 131_16 outputs eight (8) bits of data in parallel. Signals DI1 through DI16 are input to the sixteen (16) output buffer groups 131_1 through 131_16, respectively. Each of the signals DI1 through DI16 includes eight (8) bits of input data, and each of the output buffer groups 131_1 through 131_16 outputs eight (8) bits of output data. In other words, one-hundred twenty eight (128) bits of data are input to the output buffer unit 131 in parallel, and the output buffer unit 131 outputs one-hundred twenty eight (128) bits of data in parallel.

The first through third strobe signals DQS1 through DQS3 are input to each of the output buffer groups 131_1 through 131_16, and each of the output buffer groups 131_1 through 131_16 outputs eight (8) bits of data. Thus, if one of the first through third strobe signals DQS1 through DQS3 is enabled, the sixteen (16) output buffer groups 131_1 through 131_16 are activated and output one-hundred twenty eight (128) bits of data DQ1 through DQ128. When all of the first through third strobe signals DQS1 through DQS3 are disabled, all of the sixteen (16) output buffer groups 131_1 through 131_16 are deactivated and do not output data.

Data processing efficiency of the synchronous DRAM semiconductor device 101 depends on the number of output buffer groups. The synchronous DRAM semiconductor device 101 shown in FIG. 1 includes the sixteen (16) output buffer groups 131_1 through 131_16, and correspondingly, the synchronous DRAM semiconductor device 101 outputs 128-bits of data. In other words, the synchronous DRAM semiconductor device 101 may input and output 128-bits of data at once. Data output by the synchronous DRAM semiconductor device 101 is transmitted to an external memory device or a controller, and data is input to the synchronous DRAM semiconductor device 101 from the external memory device or a controller, for example.

The output buffers in the buffer unit 131 convert voltage levels of input data to voltage levels suitable for operations of an external apparatus, for example.

Table 2 below shows power consumed by the synchronous DRAM semiconductor device 101 according to the number of output buffers activated by a single strobe signal.

TABLE 2

| Number Of Output Buffers Controlled By Single Strobe Signal and Consumed Power | | MSDR | MDDR | MDDR2 |
|---|---|---|---|---|
| Consumed Power [mW] | 8 Buffers | 18.4 | 36.8 | 73.7 |
| | 16 Buffers | 9.2 | 18.4 | 36.8 |
| | 32 Buffers | 4.6 | 9.2 | 18.4 |

Figure 2:
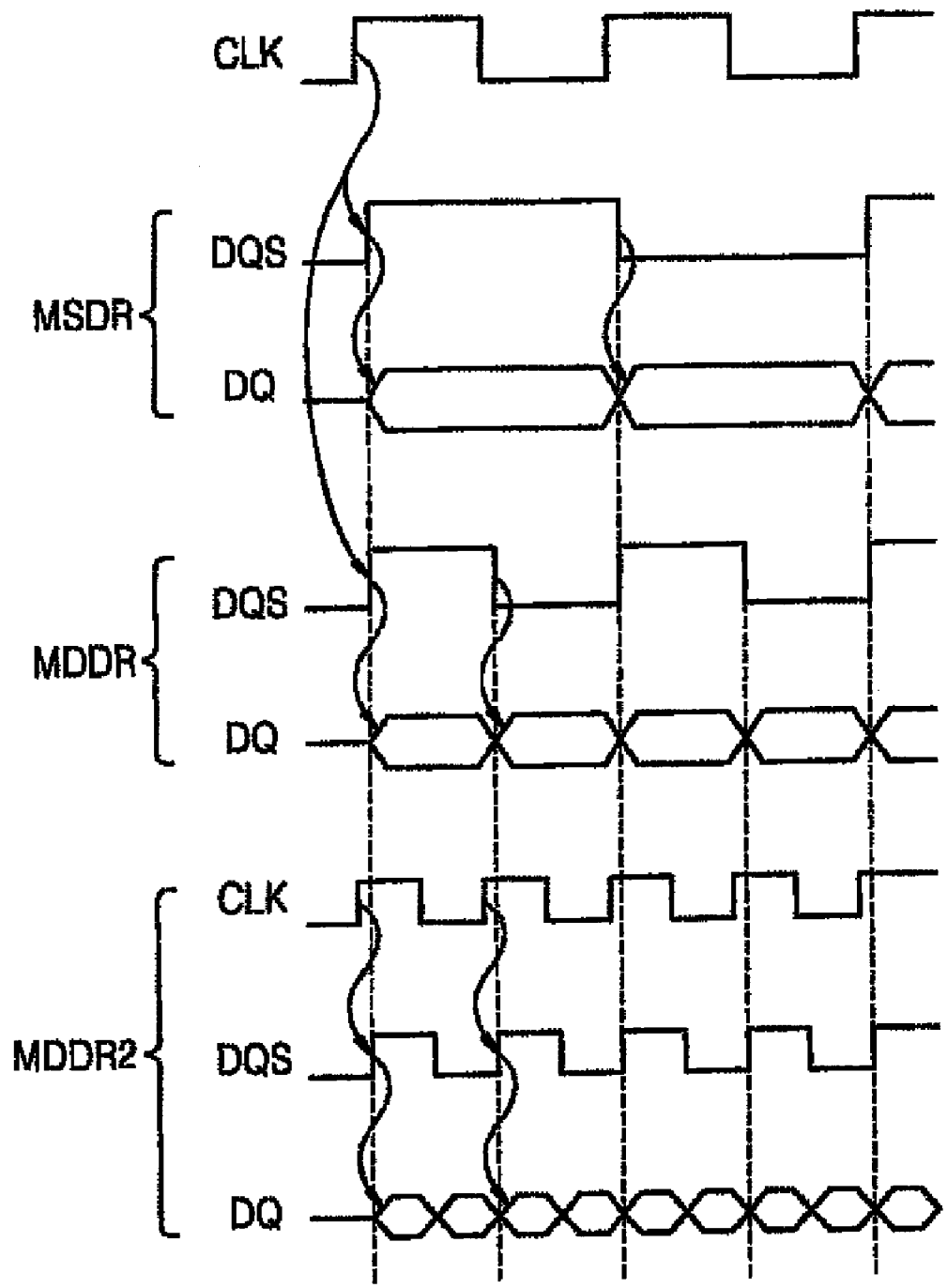
FIG. 2 is a timing diagram of a clock signal, an output strobe signal and output data according to the type of the synchronous DRAM semiconductor device shown in FIG. 1.

Referring to Table 2, consumed power varies according to the type of the synchronous DRAM semiconductor device 101. In other words, a mobile double data rate (MDDR) DRAM semiconductor device consumes about twice as much power as a mobile single data rate (MSDR) DRAM semiconductor device, and a MDDR2 DRAM semiconductor device consumes about twice as much power as the MDDR DRAM semiconductor device. The reason is that, as shown in FIG. 2, the rate of data input/output to/from the MDDR DRAM semiconductor device is about twice as much as the rate of data input and output to/from the MSDR DRAM semiconductor device, because the frequency of a strobe signal DQS used in the MDDR DRAM semiconductor device is twice as high as frequency of a strobe signal DQS used in the MSDR DRAM semiconductor device. In the same regard, the rate of data input/output to/from the MDDR2 DRAM semiconductor device is about twice as much as the rate of data input and output to/from the MDDR DRAM semiconductor device, because the frequency of a strobe signal DQS used in the MDDR2 DRAM semiconductor device is twice as high as the frequency of a strobe signal DQS used in the MDDR DRAM semiconductor device.

In the depicted embodiment, the frequency of a clock signal CLK used in the MSDR DRAM semiconductor device and the frequency of a clock signal CLK used in the MDDR DRAM semiconductor device are the same, whereas the frequency of a clock signal CLK used in the MDDR2 DRAM semiconductor device is twice as high as the frequency of the clock signal CLK used in the MSDR DRAM semiconductor device or the frequency of the clock signal CLK used in the MDDR DRAM semiconductor device.

Accordingly, power consumed by the synchronous DRAM semiconductor device 101 varies according to the number of output buffers activated by a single strobe signal. In other words, as more output buffers are activated by a single strobe signal, the synchronous DRAM semiconductor device 101 consumes less power. More specifically, when the number of output buffers activated by a single strobe signal is doubled, power consumption of the synchronous DRAM semiconductor device 101 is reduced to half.

For example, referring to Table 2, if 18.4 [mW] of power is consumed when eight (8) output buffers are activated by a single strobe signal in a MSDR DRAM semiconductor device, consumed power is reduced to half, i.e., 9.2 [mW], when sixteen (16) output buffers are activated by a single strobe signal. Likewise, consumed power is reduced to one-fourth (¼), i.e., 4.6[mW], when thirty-two (32) output buffers are activated by a single strobe signal.

Furthermore, when eight (8) output buffers are activated by a single strobe signal in a MDDR DRAM semiconductor device, twice as much power, i.e., 36.8 [mW], is consumed as compared to the MSDR DRAM semiconductor device. Here, consumed power is reduced to half, i.e., 18.4 [mW] when sixteen (16) output buffers are activated by a single strobe signal, and consumed power is reduced to one-fourth (¼), i.e., 9.2 [mW], when thirty-two (32) output buffers are activated by a single strobe signal.

Furthermore, when eight (8) output buffers are activated by a single strobe signal in a MDDR2 DRAM semiconductor device, twice as much power, i.e., 73.7 [mW], is consumed as compared to the MDDR DRAM semiconductor device. Here, consumed power is reduced to half, i.e., 36.8 [mW], when sixteen (16) output buffers are activated by a single strobe signal, and consumed power is reduced to one-fourth (¼), i.e., 18.4 [mW], when thirty-two (32) output buffers are activated by a single strobe signal.

Although FIG. 1 shows an illustrative configuration in which the synchronous DRAM semiconductor device 101 outputs 128-bits of data, the configuration of the synchronous DRAM semiconductor device 101 shown in FIG. 1 may be modified and applied to cases in which more bits of data are output by the synchronous DRAM semiconductor device 101, e.g., 256 bits of data, 512 bits of data, 1024 bits of data, and so on. As a result, the modified synchronous DRAM semiconductor device 101 may consume less power.

Furthermore, in various embodiments, the number of output buffers that operate in synchronization with a single strobe signal may be greater than thirty-two (32). At this point, the number of signals A3 and A4 input to the strobe control unit 111 becomes greater than two (2), and thus the number of strobe control signals may be greater than three (3). As a result, the number of output buffers activated by a single strobe signal may be greater than thirty-two (32), and thus power consumption of the synchronous DRAM semiconductor device 101 having such a structure may be further reduced.

In other words, either all of or $$\frac{1}{2^n}$$

(where n is a natural number) of the multiple strobe buffers 121_1 through 121_16 are simultaneously activated in response to the first through third strobe control signals S1 through S3. Here, when all of the strobe buffers 121_1 through 121_16 are simultaneously activated, eight (8) bits of data are simultaneously output from eight (8) output buffers in response to a single strobe signal. When $$\frac{1}{2^n}$$

(where n is a natural number) of the strobe buffers 121_1 through 121_16 are simultaneously activated, 8×2" (where n is a natural number) output buffers are activated in response to a single strobe signal.

Figure 3A:
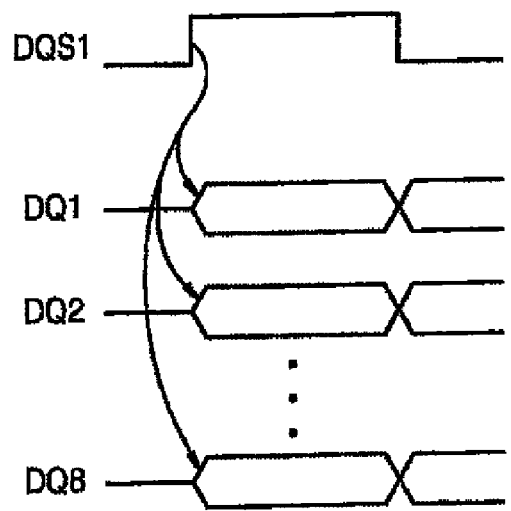
FIGS. 3A through 3C show rate of data that are output in synchronization with first through third strobe signals shown in FIG. 1.
Figure 3B:
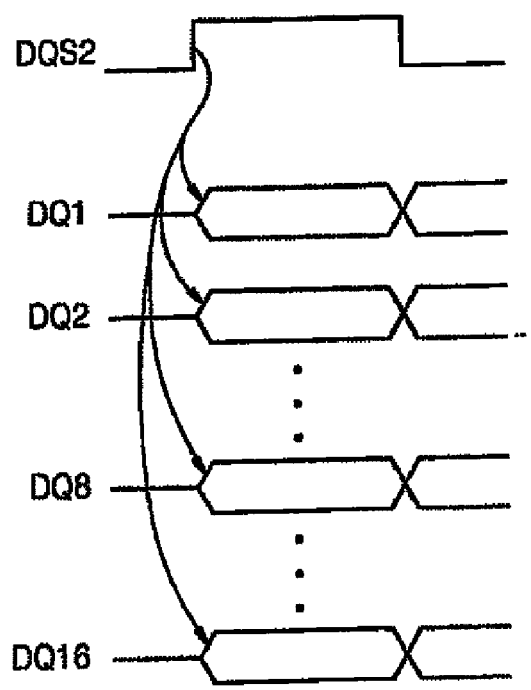
Figure 3C:
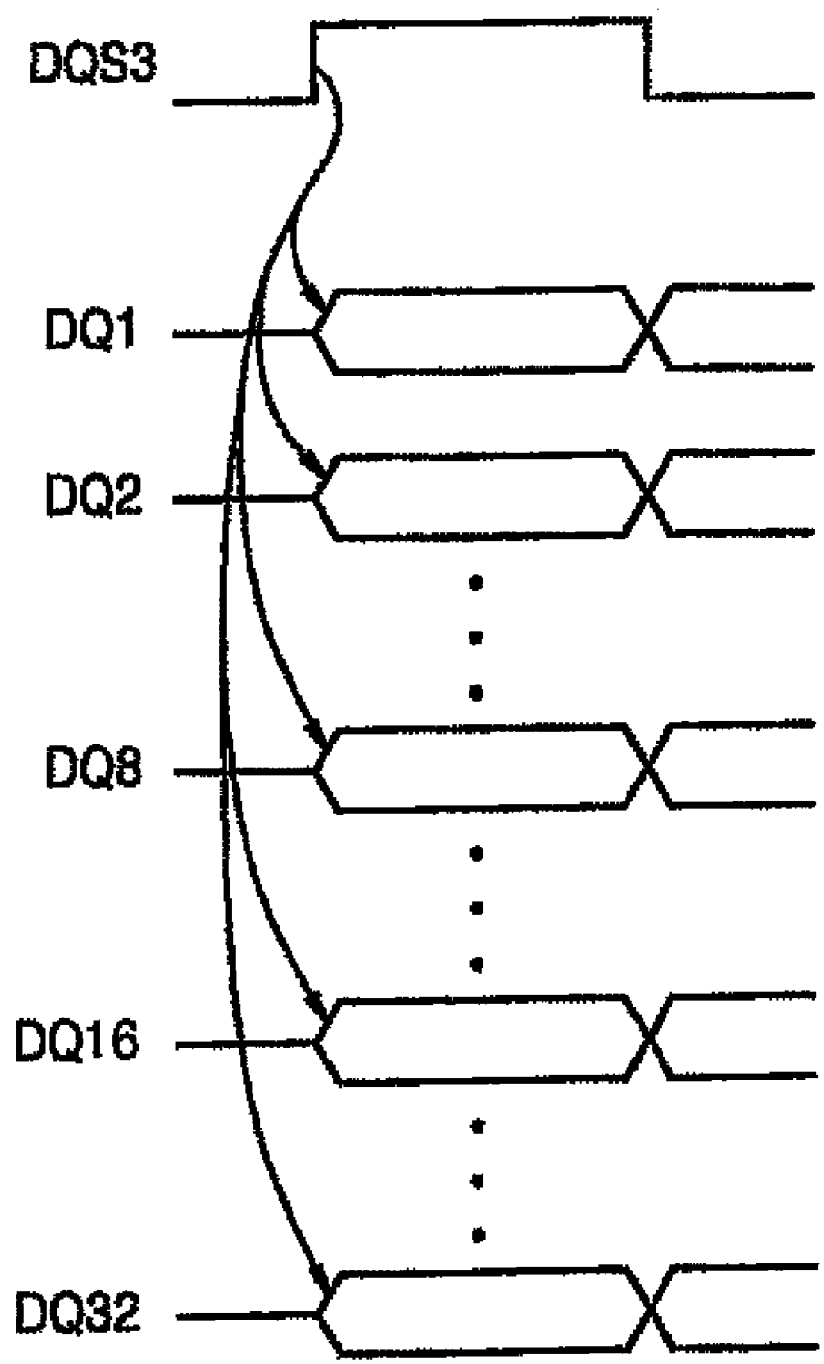

FIGS. 3A through 3C show rates of data that are output in synchronization with the first through third strobe signals DQS1 through DQS3 shown in FIG. 1.

Referring to FIG. 3A, when the first strobe signal DQS1 is enabled as logic high, 8-bits of data DQ1 through DQ8 are simultaneously output. In other words, eight (8) output buffers are simultaneously activated with respect to one (1) strobe buffer. Thus, the synchronous DRAM semiconductor device (101 of FIG. 1) groups 128-bits of output data DQ1 through DQ128 into sixteen (16) groups of eight (8) bits of data and outputs the data groups in parallel.

Referring to FIG. 3B, when the second strobe signal DQS2 is enabled as logic high, 16-bits of data DQ1 through DQ16 are simultaneously output. In other words, sixteen (16) output buffers are simultaneously activated with respect to one (1) strobe buffer. Thus, the synchronous DRAM semiconductor device (101 of FIG. 1) groups 128-bits of output data DQ1 through DQ128 into eight (8) groups of sixteen (16) bits of data and outputs the data groups in parallel.

Referring to FIG. 3C, when the third strobe signal DQS3 is enabled as logic high, 32-bits of data DQ1 through DQ32 are simultaneously output. In other words, thirty-two (32) output buffers are simultaneously activated with respect to one (1) strobe buffer. Thus, the synchronous DRAM semiconductor device (101 of FIG. 1) groups 128-bits of output data DQ1 through DQ128 into four (4) groups of thirty-two (32) bits of data, and outputs the data groups in parallel.

Although FIGS. 3A through 3C show that data is output when the first strobe signal DQS1 is enabled as logic high, data may also be output when the first strobe signal DQS1 is enabled as logic low.

Although FIGS. 3A through 3C show portions of output data, the method equally applies to all bits of output data DQ1 through DQ128.

As described above, the synchronous DRAM semiconductor device 101 includes the strobe control unit 111, and thus one-hundred twenty eight (128) bits of data DQ1 through DQ128 may be output from of the synchronous DRAM semiconductor device 101 in parallel by operating the sixteen (16) strobe buffers 121_1 through 121_16. Thus, power consumption of the synchronous DRAM semiconductor device 101 is reduced.

Figure 4:
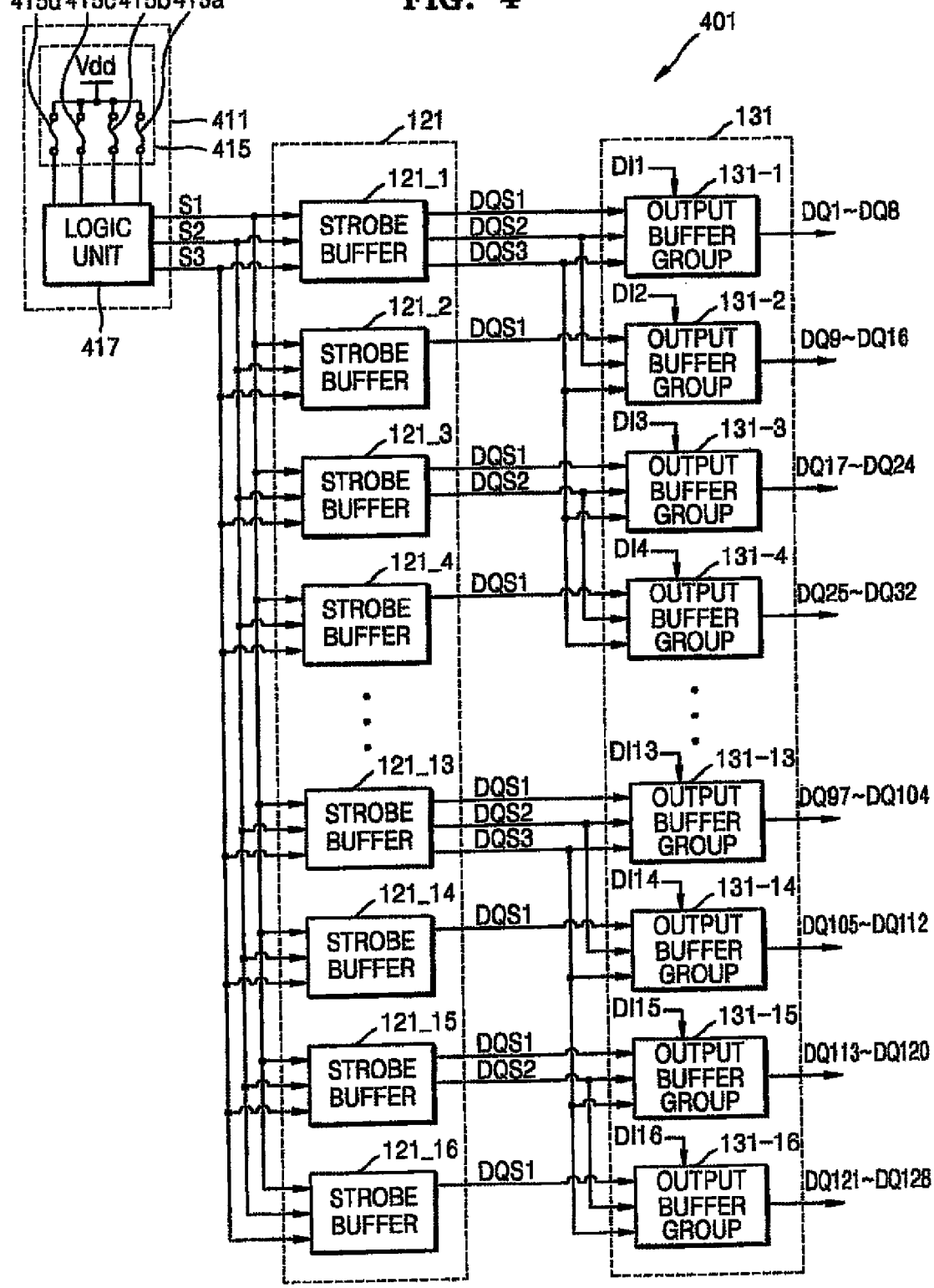
FIG. 4 is a block diagram of a synchronous DRAM semiconductor device, according to another embodiment of the inventive concept.

FIG. 4 is a block diagram of a synchronous DRAM semiconductor device 401 according to another embodiment of the inventive concept. Referring to FIG. 4, the synchronous DRAM semiconductor device 401 includes a strobe control unit 411, the strobe buffer unit 121, and the output buffer unit 131.

Compared to the embodiment shown in FIG. 1, the strobe control unit 411 according to the present embodiment is configured differently from the strobe control unit 111 according to the embodiment shown in FIG. 1, while the strobe buffer unit 121 and the output buffer unit 131 are substantially the same in both of the embodiments. Thus, detailed descriptions of the strobe buffer unit 121 and the output buffer unit 131 will not be repeated, and only the strobe control unit 411 will be described.

Referring to FIG. 4, the strobe control unit 411 includes a fuse unit 415 and a fuse signal combining unit or logic unit 417.

The fuse unit 415 includes multiple fuses 415a through 415d. A power voltage Vdd is applied to first ends of the fuses 415a through 415d, and second ends of the fuses 415a through 415d are connected to the logic unit 417. The power voltage Vdd applied to the fuses 415a through 415d while the fuses 415a through 415d are connected to the logic unit 417 is applied to the fuse signal combining unit 417, and the power voltage Vdd applied to the fuses 415a through 415d while the fuses 415a through 415d are not connected to the logic unit 417 is not applied to the fuse signal combining unit 417.

The logic unit 417 generates the strobe control signals S1 through S3 according to which of the fuses 415a through 415d are disconnected and connected to the logic unit 417. For example, the logic unit 417 outputs the first strobe control signal S1 when only the first fuse 415a is disconnected and the remaining fuses 415b through 415d are connected, outputs the second strobe control signal S2 when the first and second fuses 415a and 415b are disconnected and the remaining fuses 415c and 415d are connected, and outputs the third strobe control signal S3 when the first through third fuses 415a through 415c are disconnected and the only remaining fuse 415d is connected. The logic unit 417 may be formed of logic gates, such as AND gates and OR gates, for example.

Alternatively, the logic unit 417 may generate the first through third strobe control signals S1 through S3 by combining signals output by the fuses 415a through 415d in various alternative ways. For example, the logic unit 417 may be configured to output the first strobe control signal S1 when only the first fuse 415a is disconnected and the remaining fuses 415b through 415d are connected, to output the second strobe control signal S2 when only the second fuse 415b is disconnected and the remaining fuses 415a, 415c, and 415d are connected, and to output the third strobe control signal S3 when only the third fuse 415c is disconnected and the remaining fuses 415a, 415b, and 415d are connected.

The fourth fuse 415d, in addition to the first through third fuses 415a through 415c, for example, may be a spare fuse. The spare fuse may be used as a backup fuse or may be used when the synchronous DRAM semiconductor device 401 is capable of processing more than 128-bits of output data or when a single strobe signal controls more than thirty-two (32) output buffers.

Accordingly, the strobe control unit 411 includes the fuse unit 415 and the fuse logic unit 417 to control the strobe buffer unit 121. Thus, power consumption of the synchronous DRAM semiconductor device 401 is reduced.

Meanwhile, the strobe control unit 411 may include the fuses 415a through 415d. In this case, the strobe control unit 411 may be configured to output the first strobe control signal S1 when the second and third fuses 415b and 415c are disconnected and only the first fuse 415a is connected, to output the second strobe control signal S2 when the first and third fuses 415a and 415c are disconnected and only the second fuse 415b is connected, and to output the third strobe control signal S3 when the first and second fuses 415a and 415b are disconnected and only the third fuse 415c is connected. Of course, the strobe control unit 411 may generate the strobe control signals S1 through S3 in various ways other than the illustrative configuration described above, without departing from the scope of the present teachings.

Figure 5:
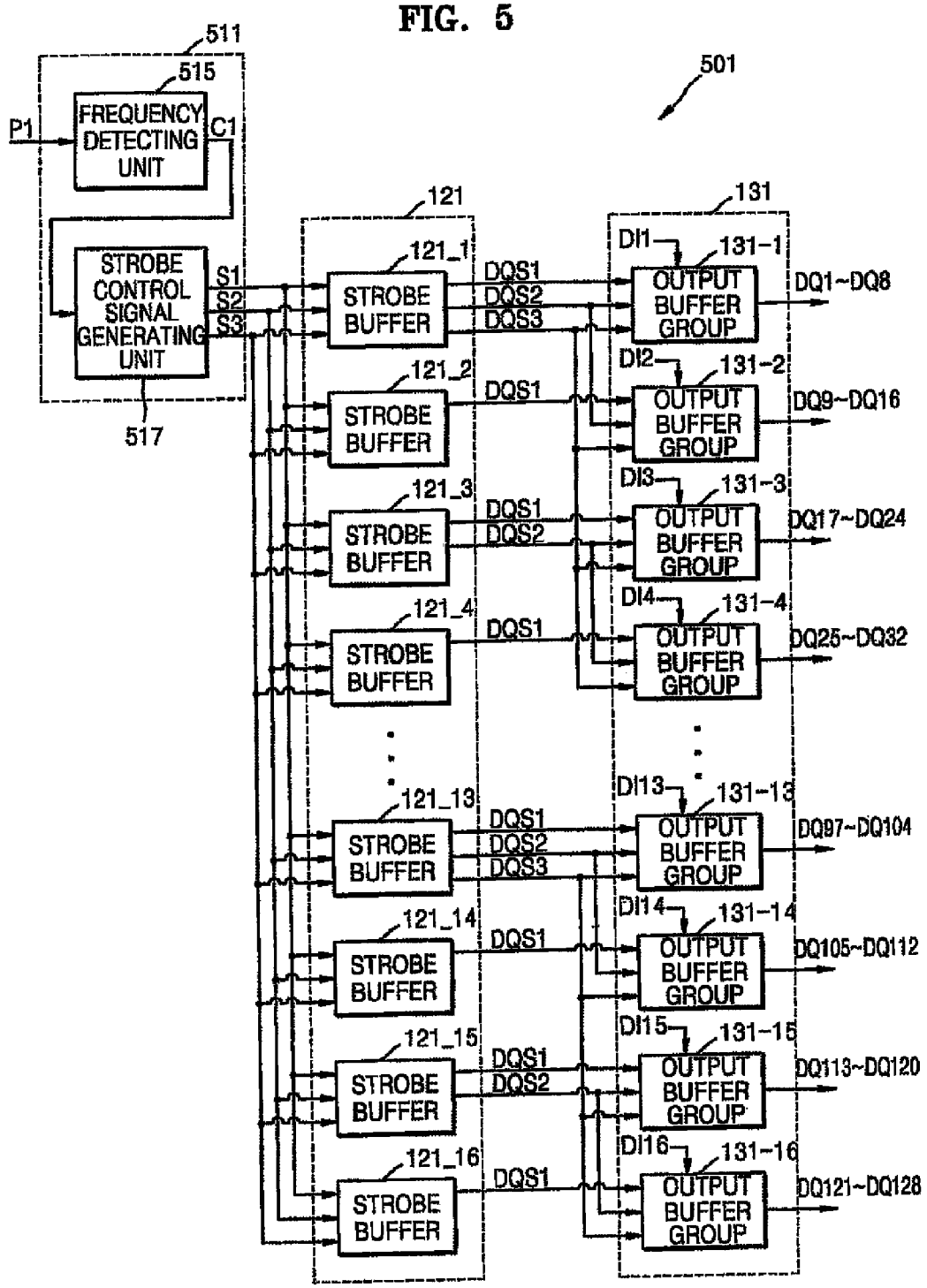
FIG. 5 is a block diagram of a synchronous DRAM semiconductor device, according to another embodiment of the inventive concept.

FIG. 5 is a block diagram of a synchronous DRAM semiconductor device 501 according to another embodiment of the inventive concept. Referring to FIG. 5, the synchronous DRAM semiconductor device 501 includes a strobe control unit 511, the strobe buffer unit 121, and the output buffer unit 131.

Compared to the embodiment shown in FIG. 1, the strobe control unit 511 according to the present embodiment is configured differently from the strobe control unit 111 according to the embodiment shown in FIG. 1, while the strobe buffer unit 121 and the output buffer unit 131 are substantially the same in both of the embodiments. Thus, detailed descriptions of the strobe buffer unit 121 and the output buffer unit 131 will not be repeated, and only the strobe control unit 511 will be described.

Referring to FIG. 5, the strobe control unit 511 includes a frequency detecting unit 515 and a strobe control signal generating unit 517.

The frequency detecting unit 515 detects the frequency of an input signal P1, generates an output signal C1 according to the detected frequency of the input signal P1, and transmits the output signal C1 to the strobe control signal generating unit 517. For example, the frequency detecting unit 515 may output a first signal when the input signal P1 has the same frequency as a clock signal used by a SDRAM, output a second signal when the input signal P1 has the same frequency as a clock signal used by a DDR DRAM, and output a third signal when the input signal P1 has the same frequency as a clock signal used by a DDR2 DRAM.

The strobe control signal generating unit 517 receives the output signal C1 transmitted from the frequency detecting unit 515 and outputs the strobe control signals S1 through S3, accordingly. The strobe control signal generating unit 517 outputs the first strobe control signal S1 when the output signal C1 as the first signal is input, outputs the second strobe control signal S2 when the output signal C1 as the second signal is input, and outputs the third strobe control signal S3 when the output signal C1 as the third signal is input.

Accordingly, the strobe control unit 511 includes the frequency detecting unit 515 and the strobe control signal generating unit 517 to control the strobe buffer unit 121. Thus, power consumption of the synchronous DRAM semiconductor device 501 is reduced.

Meanwhile, the strobe control unit 511 may only include the frequency detecting unit 515 to control the strobe buffer unit 121. In this case, the frequency detecting unit 515 may be configured to output the first strobe control signal S1 when the input signal P1 has the same frequency as a clock signal used by a SDRAM, to output the second strobe control signal S2 when the input signal P1 has the same frequency as a clock signal used by a DDR DRAM, and to output a third strobe control signal S3 when the input signal P1 has the same frequency as a clock signal used by a DDR2 DRAM.

Figure 6:
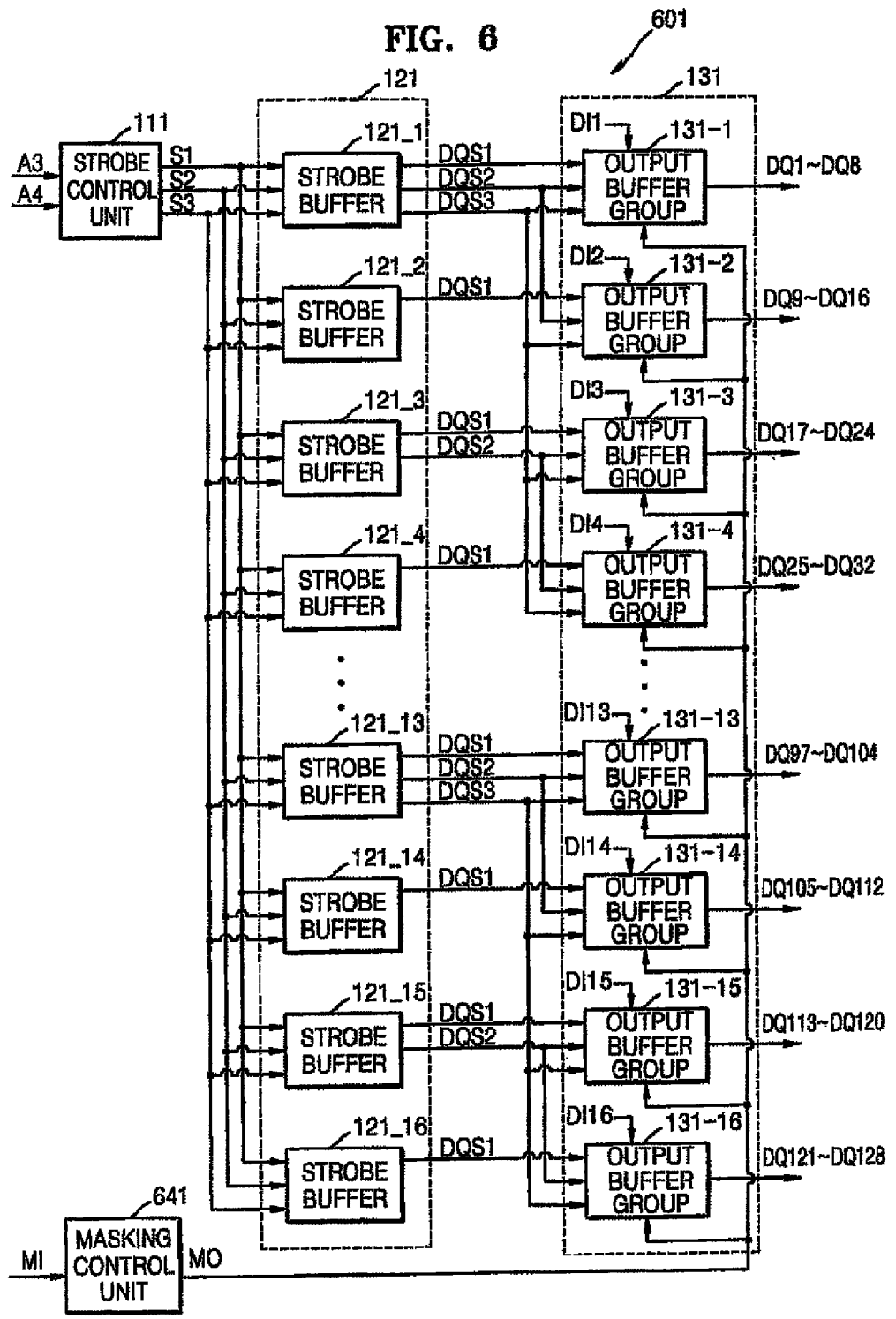
FIG. 6 is a block diagram of a synchronous DRAM semiconductor device, according to another embodiment of the inventive concept.

FIG. 6 is a block diagram of a synchronous DRAM semiconductor device 601 according to another embodiment of the inventive concept. Referring to FIG. 6, the synchronous DRAM semiconductor device 601 includes the strobe control unit 111, the strobe buffer unit 121, the output buffer unit 131, and a masking control unit 641.

The strobe control unit 111, the strobe buffer unit 121 and the output buffer unit 131 according to the present embodiment may be substantially the same as the strobe control units 111, 411 and/or 511, the strobe buffer unit 121, and the output buffer units 131 according to the embodiments shown in FIGS. 1, 4, and 5, respectively, and thus detailed descriptions thereof will not be repeated.

The masking control unit 641 is connected to all of the output buffers in the output buffer unit 131. The masking control unit 641 outputs multiple masking signals MO in response to an externally input masking control signal MI. When the masking signals MO are activated, the output buffers in the output buffer unit 131 are masked. In other words, when the synchronous DRAM semiconductor device 601 is not required to output data, masking signals MO are activated to block data output from the output buffers. When masking signals MO are activated, output buffers corresponding to the activated masking signals MO are deactivated and do not output data.

Accordingly, the synchronous DRAM semiconductor device 601 may include the masking control unit 641 to block unwanted data output from the synchronous DRAM semiconductor device 601. Thus, power consumption of the synchronous DRAM semiconductor device 601 is reduced.

Masking data may also be applied when data is externally input to the synchronous DRAM semiconductor device 601. In other words, the synchronous DRAM semiconductor device 601 may further include multiple input buffers, and may mask a portion of the input buffers using the masking control unit 641. Therefore, data externally input to the masked input buffers may be not transmitted into the synchronous DRAM semiconductor device 601.

Figure 7:
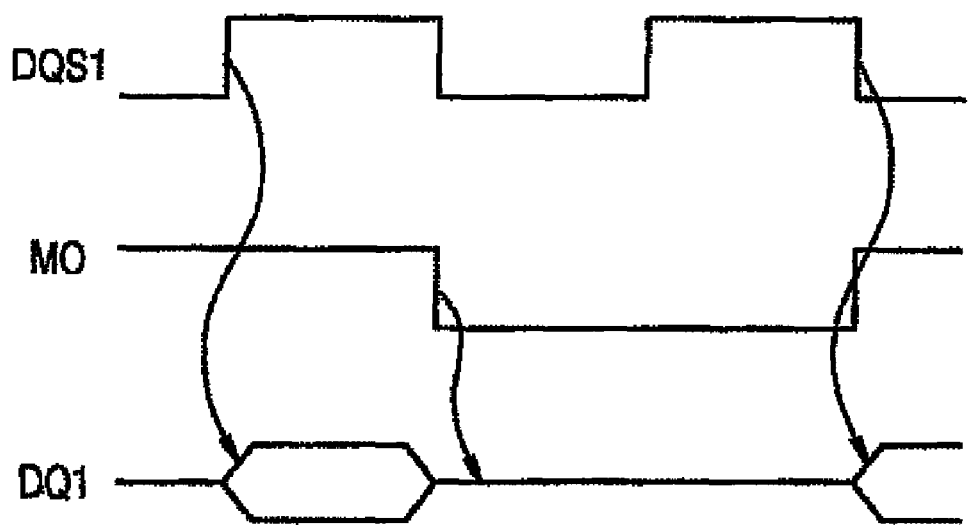
FIG. 7 is a timing diagram of a strobe signal, a masking signal and output data shown in FIG. 6.

FIG. 7 is an illustrative timing diagram of strobe signal DQS1, masking signal MO, and output data DQ1, shown in FIG. 6. Referring to FIG. 7, when the strobe signal DQS1 is enabled as logic high, the output data DQ1 is output by an output buffer to which the strobe signal DQS1 is input. However, when the masking signal MO is enabled as logic low, the output buffer is deactivated and does not output the output data DQ1.

Alternatively, the state in which the masking signal MO is logic high may be defined as an enabled state.

Accordingly, data DQ1 is not output by an output buffer when the masking signal MO is enabled, and thus power consumption of the synchronous DRAM semiconductor device 601 is reduced.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A synchronous dynamic random access memory (DRAM) semiconductor device, comprising:
   a plurality of output buffers, each of the output buffers being configured to output one bit of data;
   a strobe control unit configured to output a plurality of strobe control signals in response to externally provided input signals; and
   a plurality of strobe buffers, each of which is connected to at least one of the plurality of output buffers and configured to output at least one strobe signal,
   wherein at least one of the plurality of strobe buffers is activated in response to the plurality of strobe control signals ("the activated strobe buffers"), such that at least one of the plurality of output buffers is activated in response to strobe signals output by the activated strobe buffers.

2. The synchronous DRAM semiconductor device of claim 1, wherein more than eight (8) of the plurality of output buffers are activated in response to the strobe signals output by the activated strobe buffers.

3. The synchronous DRAM semiconductor device of claim 1, wherein one of all of the plurality of strobe buffers, and $$\frac{1}{2^n}$$

(n being a natural number) of the plurality of strobe buffers are simultaneously activated in response to the plurality of strobe signals output by the activated strobe buffers.

4. The synchronous DRAM semiconductor device of claim 3, wherein when all of the plurality of strobe buffers are activated, eight (8) of the plurality of output buffers are simultaneously activated by one of the activated strobe buffers.

5. The synchronous DRAM semiconductor device of claim 3, wherein when $$\frac{1}{2^n}$$

(n being a natural number) of the plurality of strobe buffers are activated, $8 \times 2^n$ (n being a natural number) of the plurality of output buffers are simultaneously activated by one of the activated strobe buffers.

6. A synchronous dynamic random access memory (DRAM) semiconductor device, comprising:
   a plurality of output buffers, each being configured to output one bit of data;
   a strobe control unit configured to output a plurality of strobe control signals in response to externally provided input signals;
   a plurality of strobe buffers, each of which is connected to at least one of the plurality of output buffers and configured to output at least one strobe signal, wherein at least one of the plurality of strobe buffers is activated in response the plurality of strobe control signals ("the activated strobe buffers"), such that at least one of the plurality of output buffers is activated in response to strobe signals output by the activated strobe buffers; and
   a masking control unit connected to the plurality of output buffers and configured to mask at least one of the plurality of the output buffers, wherein the masked output buffers do not output data.

7. The synchronous DRAM semiconductor device of claim 1, wherein the strobe control unit comprises an expanded mode register set (EMRS) that outputs the plurality of strobe control signals.

8. The synchronous DRAM semiconductor device of claim 6, wherein more than eight (8) of the plurality of output buffers are activated in response to the strobe signals output by the activated strobe buffers.

9. The synchronous DRAM semiconductor device of claim 6, wherein one of all of the plurality of strobe buffers, and $$\frac{1}{2^n}$$

(n being a natural number) of the plurality of strobe buffers are simultaneously activated in response to the plurality of strobe signals output by the activated strobe buffers.

10. The synchronous DRAM semiconductor device of claim 9, wherein when all of the plurality of strobe buffers are activated, eight (8) of the plurality of output buffers are simultaneously activated by one of the activated strobe buffers.

11. The synchronous DRAM semiconductor device of claim 9, wherein when $$\frac{1}{2^n}$$

(n being a natural number) of the plurality of strobe buffers are activated, 8×2' (n being a natural number) of the plurality of output buffers are simultaneously activated by one of the activated strobe buffers.

12. The synchronous DRAM semiconductor device of claim 6, wherein the strobe control unit comprises an expanded mode register set (EMRS) that outputs the plurality of strobe control signals.

13. A synchronous dynamic random access memory (DRAM) semiconductor device comprising:

a plurality of output buffers, each being configured to output one bit of data;

a plurality of strobe buffers, each respectively connected to a corresponding one of the plurality of output buffers and configured to output at least one strobe signal; and a masking control unit connected to the plurality of output buffers and configured to mask at least one of the plurality of the output buffers, wherein the masked output buffers do not output data.

* * * * *